United States Patent [19]

Lin et al.

[11] Patent Number: 5,703,911
[45] Date of Patent: Dec. 30, 1997

[54] DECODING METHOD FOR TRELLIS CODES WITH LARGE FREE DISTANCES

[75] Inventors: Mao-Chao Lin, Yung-Ho; Jia-Yin Wang, Taipei, both of Taiwan

[73] Assignee: Chung-Chin Chen, Alexandria, Va.

[21] Appl. No.: 516,217

[22] Filed: Aug. 17, 1995

[51] Int. Cl.[6] .................. H03M 13/12; H04L 1/00
[52] U.S. Cl. .................. 375/341; 375/265; 371/43
[58] Field of Search .................. 375/262, 265, 375/298, 341; 371/43

[56] References Cited

U.S. PATENT DOCUMENTS

| | | | |
|---|---|---|---|
| 4,881,241 | 11/1989 | Pomier et al. | 371/43 |
| 5,113,401 | 5/1992 | Chevillat et la. | 371/43 |
| 5,406,570 | 4/1995 | Berrou et al. | 375/341 |
| 5,570,391 | 10/1996 | Lin et al. | 375/265 |

FOREIGN PATENT DOCUMENTS

63-111737  5/1988  Japan.

*Primary Examiner*—Stephen Chin
*Assistant Examiner*—Jeffrey W. Gluck
*Attorney, Agent, or Firm*—Bacon & Thomas

[57] ABSTRACT

This invention is a decoding method for a special class of trellis codes which have large free distances. The encoding of the trellis code to be decoded can be implemented by employing a single binary convolutional code followed by more than one processor. The decoding can be implemented by using the trellis of the binary convolutional code and additional processors.

11 Claims, 5 Drawing Sheets

TCM of the second embodiment

FIG. 10

DECODING METHOD FOR TRELLIS CODES WITH LARGE FREE DISTANCES

BACKGROUND OF THE INVENTION

In a digital communication system, the transmission of information will be corrupted by channel noise or other channel defects, and hence transmission errors are likely to occur. In a digital communication system which requires high reliability, channel coding is usually needed to lower the probability of transmission errors. In a channel coding design, the digitized information will be mapped into corresponding codewords (or code paths). The set of all codewords is called a code. The distance property among codewords can be used to correct transmission errors. In this way, the transmission reliability can be increased. The mapping between the set of information and the set of codewords is called "coding" or "encoding". If the symbols in each codeword are binary symbols, the channel coding is a binary coding. Sometimes, the mapping is also referred as "code". The procedure of recovering the information from the received symbols which are possibly error-corrupted is called "decoding".

The binary trellis code is a frequently used channel coding technique. For a rate k/n binary trellis code, at each time unit, k-message bits are fed into the encoder, which generates n code bits as output. The n code bits depend not only on the k message bits currently used as input to the encoder but also depend on message bits which were used as input to the encoder at some earlier time units. A binary trellis code is hence a kind of coding with memory. The codewords of a binary trellis code can be represented by paths in a trellis. The most important class of binary trellis codes is the class of binary convolutional codes. A binary convolutional code is a linear time-invariant binary trellis code. Binary convolutional codes were introduced several decades ago and are still very popular now.

Figure 1:
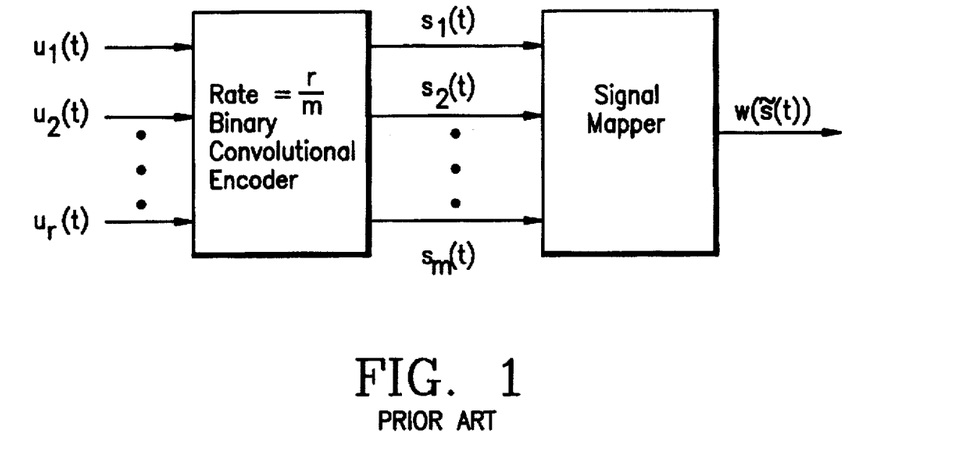
FIG. 1 illustrates the encoding method for the Ungerboeck's TCM, where $w(\tilde{s}(t))=w(s_1(t),s_2(t), \ldots, s_m(t))$.

In the 1982 paper entitled "Channel coding with multilevel/phase signals," published in *IEEE Trans. Inform. Theory.*, vol. 28, no. 1, pp. 55–67, G. Ungerboeck proposed a new idea of channel coding, in which the design of trellis coding and modulation are integrated, called trellis coded modulation (TCM). Consider the signal space $\Omega$, which consists of $2^m$ signal points $\{z_1, z_2, \ldots, z_{2^m}\}$. Every signal point $z$ in $\Omega$ corresponds to a unique binary m-tuple $\bar{s}=(s_1,s_2,\ldots,s_m)$ for $z \in \{z_1,z_2,\ldots,z_{2^m}\}$ and $s_1, s_2, \ldots, s_m \in \{0,1\}$. If we want to design a TCM with r information bits per signal point, the encoding of Ungerboeck's TCM is as shown in FIG. 1. At the t-th time unit, the encoder of the convolutional code C converts the r-bit message $\tilde{u}(t)=(u_1(t),u_2(t),\ldots,u_r(t))$ into an m-bit output $\tilde{s}(t)=(s_1(t),s_2(t),\ldots,s_m(t))$, which is then mapped into a signal point $w(\tilde{s}(t))$ of the signal space $\Omega$.

Binary trellis codes and trellis coded modulation (TCM) can be included in a class of codes called trellis codes. The performances of a trellis code are primarily evaluated by the three parameters: coding rate, decoding complexity and probability of decoding errors. Designing a trellis code with high coding rate, low decoding complexity and low probability of decoding errors is always a goal in the area of digital communications. To achieve low probability of decoding errors for a trellis coding system, a very large free distance is desired.

Figure 2:
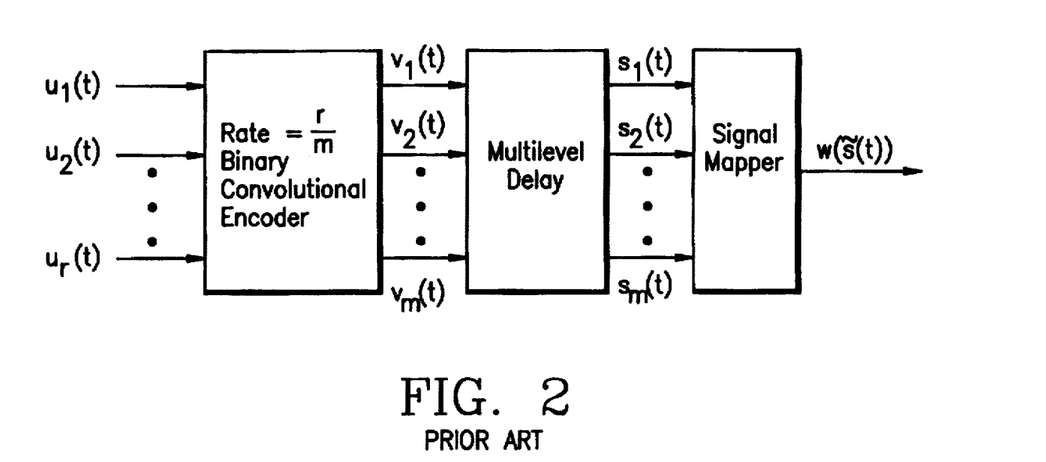
FIG. 2 illustrates the encoding method for the trellis code proposed by Lin and Wang, where $w(\tilde{s}(t))=w(s_1(t),s_2(t), \ldots, s_m(t))$.

In 1995, Lin and Wang in their U.S. patent application Ser. No. 08/398,797 filed on Mar. 6, 1995 proposed a class of trellis codes for which the encoding can be implemented by introducing a multilevel delay processor between the binary convolutional encoder and the signal mapper. The encoding is shown in FIG. 2. At the t-th time unit, the encoder of the convolutional code C converts the r-bit message $\tilde{u}(t)$ into an m-bit output $\tilde{v}(t)=(v_1(t),v_2(t),\ldots,v_m(t))$, which is fed into the multilevel delay processor. The output of the multilevel delay processor is $\bar{s}(t)=(s_1(t),s_2(t),\ldots,s_m(t))$, where $s_p(t)=v_p(t-\Sigma_{i=p}^{m}\lambda_i)$, $1 \leq p \leq m$, where $\lambda_1, \lambda_2, \ldots, \lambda_m$ are nonnegative constants. Through the signal mapper, a signal point $w(\bar{s}(t))$ in the signal space $\Omega$ is obtained as the final output. The decoding of the class of trellis codes using this trellis encoding method can be implemented by using the trellis of C.

In this invention, the inventors design a new class of trellis codes for which the encoding can be implemented by modifying the above mentioned method by introducing more multilevel delay processors and more signal mappers. The inventors show that there are trellis codes which have large free distances in the class. The inventors propose a decoding method for the new class of trellis codes. The proposed decoding method needs to use the trellis of C and some additional processors.

SUMMARY OF THE INVENTION

Figure 3:
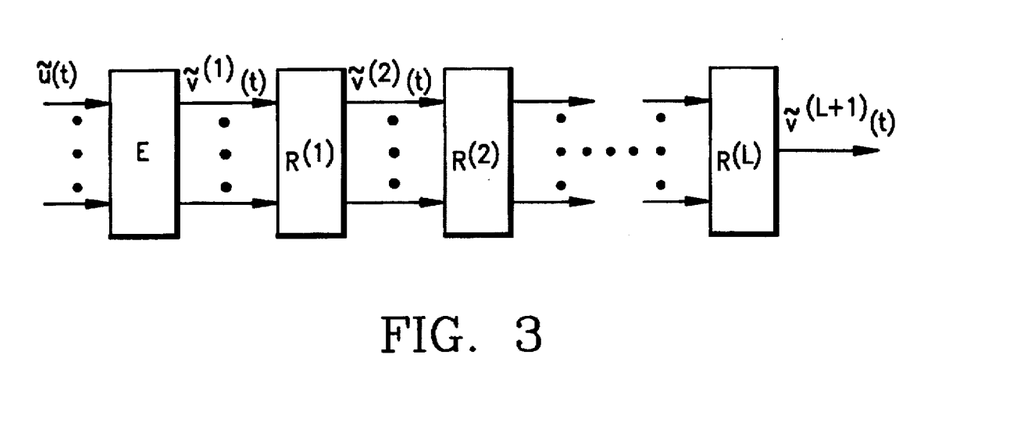
FIG. 3 illustrates an encoding method of the trellis code T suitable for the proposed decoding method, where E represents the encoder of the convolutional code $C^{(1)}$, $R^{(l)}$ represents the l-th processor, $\bar{u}=\{\ldots, \tilde{u}(t-1), \tilde{u}(t), \tilde{u}(t+1), \ldots\}$, $\bar{v}^{(l)}=\{\ldots, \tilde{v}^{(l)}(t-1), \tilde{v}^{(l)}(t), \tilde{v}^{(l)}(t+1), \ldots\}$.

This invention is a decoding method for the trellis code T of which the encoding can be implemented by first using the encoder of a binary convolutional code $C^{(1)}$ to map a message $\tilde{u}(t)$ into $\tilde{v}^{(1)}(t)$ that is sequentially converted into $\tilde{v}^{(2)}(t), \tilde{v}^{(3)}(t), \ldots,$ and $\tilde{v}^{(L+1)}(t)$ through L processors $R^{(1)}$, $R^{(2)}, \ldots,$ and $R^{(L)}$ as illustrated in FIG. 3, where $\tilde{v}^{(l)}(t)$ is a binary m-tuple, $1 \leq l \leq L$ and $\tilde{v}^{(L+1)}(t)$ is the encoded output.

Figure 4:
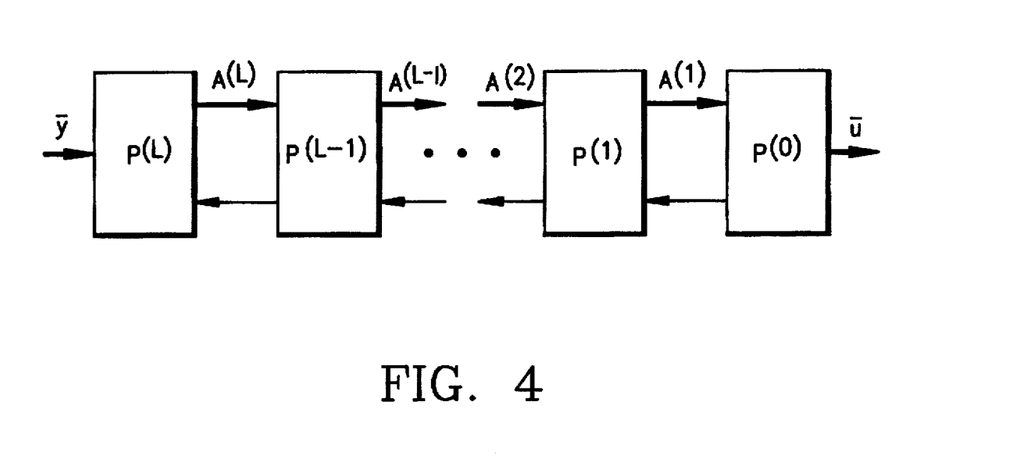
FIG. 4 illustrates the decoding method for the trellis code T, where $P^{(l)}$ represents a processor and $A^{(l)}=\{\ldots, T_M^{(l)}(t-1), T_M^{(l)}(t), \ldots\}$.

Referring to FIG. 4, the decoding method consists of using L+1 processors $P^{(L)}, P^{(L-1)}, \ldots, P^{(1)}, P^{(0)}$. Let $\Lambda^{(l)}$ be a nonnegative constant, where $1 \leq l \leq L$. Let the received symbol which is the noise-corrupted form of the symbol $\tilde{v}^{(L+1)}(t)$ be denoted by $y(t)$. The processor $P^{(L)}$ takes the received sequence $\{\ldots, y(t-1), y(t), y(t+1), \ldots\}$ as input. Based on $\tilde{v}^{(L)}(t-j)$, $j \geq \lambda$, where $\lambda$ is the truncation length used in decoding the binary convolutional code $C^{(1)}$, which have been recovered in earlier decoding and $\{y(t+j): j \leq \Lambda^{(1)} + \ldots + \Lambda^{(L)}\}$, the processor $P^{(L)}$ determines the metric M $_{\tilde{v}^{(L)}(t+\Lambda^{(1)}+\ldots+\Lambda^{(L-1)})}$ for each of the $2^m$ possible values of $\tilde{v}^{(L)}(t+\Lambda^{(1)}+\ldots+\Lambda^{(L-1)})$. Then the set $T_M^{(L)}(t+\Lambda^{(1)}+\ldots+\Lambda^{(L-1)})=\{M_{\tilde{v}^{(L)}(t+\Lambda^{(1)}+\ldots+\Lambda^{(L-1)})}: \tilde{v}^{(L)}(t+\Lambda^{(1)}+\ldots+\Lambda^{(L-1)}) \in \{0,1\}^m\}$ is fed into the processor $P^{(L-1)}$.

For $l=L-1, L-2, \ldots, 1$, the processor $P^{(l)}$ takes the metric sequence $\{\ldots, T_M^{(l+1)}(t-1), T_M^{(l+1)}(t), \ldots\}$ as input. Based on $\tilde{v}^{(l)}(t-j)$, $j \geq \lambda$ which have been recovered in earlier decoding and $\{T_M^{(l+1)}(t+j): j \leq \Lambda^{(1)} + \ldots + \Lambda^{(l)}\}$, the processor $P^{(l)}$ determines the metric $M_{\tilde{v}^{(l)}(t+\Lambda^{(1)}+\ldots+\Lambda^{(l-1)})}$ for each of the $2^m$ possible values of $\tilde{v}^{(l)}(t+\Lambda^{(1)}+\ldots+\Lambda^{(l-1)})$. Then the set $T_M^{(l)}(t+\Lambda^{(1)}+\ldots+\Lambda^{(l-1)})=\{M_{\tilde{v}^{(l)}(t+\Lambda^{(1)}+\ldots+\Lambda^{(l-1)})}: \tilde{v}^{(l)}(t+\Lambda^{(1)}+\ldots+\Lambda^{(l-1)}) \in \{0,1\}^m\}$ is fed into the processor $P^{(l-1)}$.

The processor $P^{(0)}$ takes the sequence $\{\ldots, T_M^{(1)}(t-1), T_M^{(1)}(t), \ldots\}$ as input. Based on the metrics $M_{\tilde{v}^{(1)}(t-i)} \in T_M^{(1)}(t-i)$ for $i \geq 0$, the processor $P^{(0)}$ applies the Viterbi algorithm to the trellis of $C^{(1)}$ to recover the transmitted symbol $\tilde{u}(t-\lambda+1)$ and $\tilde{v}^{(1)}(t-\lambda+1)$ if the truncation length of decoding for $C^{(1)}$ is $\lambda$.

The recovered value of $\tilde{v}^{(1)}(t-\lambda+1)$ is then fed back to $P^{(1)}$. For $l=1,2,\ldots,L-1$, the processor $P^{(l)}$ derives $\tilde{v}^{(l+1)}(t-\lambda+1)$ from $\{\tilde{v}^{(l)}(t-j): j \geq \lambda-1\}$, then feeds $\tilde{v}^{(l+1)}(t-\lambda+1)$ back to $P^{(l+1)}$. The binary m-tuples $\tilde{v}^{(1)}(t-\lambda+1), \ldots, \tilde{v}^{(L)}(t-\lambda+1)$ will be used in the following decoding time units.

3

The trellis code T which can be decoded by the proposed decoding method has a special structure and can be designed to have a large free distance. In the following, we show a more specific design of the trellis code T for which the encoding can be implemented in a multilevel way that employs the encoder of a single binary convolutional code followed by L sets of multilevel delay processors and signal mappers, where L≧2. The schematic diagram of multilevel encoding is given in FIG. 5. Suppose that the signal space used in transmitter is $\Omega$ which consists of $2^m$ signal points. Note that the signal space $\Omega$ may be a signal constellation such as 8PSK, 16QAM, or a collection of binary m-tuples such as $\{0,1\}^2$, $\{0,1\}^n$, etc. To design a trellis code T with information rate of r information bits per signal point in $\Omega$, each time r information bits are used as input to the encoder of a binary convolutional code, which is followed by L (L≧2) sets of multilevel delay processors and signal mappers to result in an output signal point in $\Omega$.

Let the input information sequence be $\bar{u}=\{\ldots, \tilde{u}(t-1), \tilde{u}(t), \tilde{u}(t+1), \ldots\}$, where $\tilde{u}(t)=(u_1(t), u_2(t), \ldots, u_r(t))$. This input sequence is fed into the encoder (denoted as E in FIG. 5) of a convolutional code $C^{(1)}$ to yield an output sequence $\bar{v}^{(1)}$, where $\bar{v}^{(1)}=\{\ldots, \tilde{v}^{(1)}(t-1), \tilde{v}^{(1)}(t), \tilde{v}^{(1)}(t+1), \ldots\}$ and $\tilde{v}^{(1)}(t)=(v_1^{(1)}(t), v_2^{(1)}(t), \ldots, v_m^{(1)}(t))$. The sequence $\bar{v}^{(1)}$ is then repeatedly processed by L sets of multilevel delay processors (denoted as $Q^{(1)}, Q^{(2)}, \ldots, Q^{(L)}$ in FIG. 5) and signal mappers (denoted as $S^{(1)}, S^{(2)}, \ldots, S^{(L)}$ in FIG. 5), where the input sequence of $Q^{(l)}$ is denoted as $\bar{v}^{(l)}$ and the output sequence of $Q^{(l)}$ is denoted as $\bar{s}^{(l)}$ for 1≦l≦L. All the sequences $\bar{v}^{(l)}$ and $\bar{s}^{(l)}$ for 1≦l≦L consist of binary m-tuples as elements (or symbols). For 1≦l≦L, write $\bar{v}^{(l)}=\{\ldots, \tilde{v}^{(l)}(t-1), \tilde{v}^{(l)}(t), \tilde{v}^{(l)}(t+1), \ldots\}$, $\bar{s}^{(l)}=\{\ldots, \tilde{s}^{(l)}(t-1), \tilde{s}^{(l)}(t), \tilde{s}^{(l)}(t+1), \ldots\}$, where $\tilde{v}^{(l)}(t)=(v_1^{(l)}(t), v_2^{(l)}(t), \ldots, v_m^{(l)}(t))$, $\tilde{s}^{(l)}(t)=(s_1^{(l)}(t), s_2^{(l)}(t), \ldots, s_m^{(l)}(t))$. The output sequence of $S^{(L)}$ is denoted as $\bar{v}^{(L+1)}=\{\ldots, \tilde{v}^{(L+1)}(t-1), \tilde{v}^{(L+1)}(t), \ldots\}$. Note that the symbol $\tilde{v}^{(l)}(t)$ for 1≦l≦L is a binary m-tuple while the symbol $w^{(L)}(\tilde{s}^{(L)}(t))=\tilde{v}^{(L+1)}(t)$ which is a signal point in $\Omega$ and may or may not be a binary m-tuple.

Figure 6:
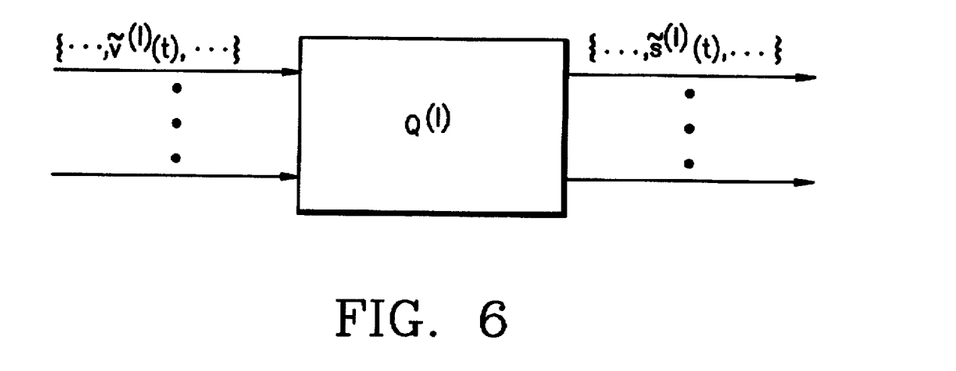
FIG. 6 is the function diagram of the l-th multilevel delay processor, where $\tilde{v}^{(l)}(t)=(v_1^{(l)}(t),v_2^{(l)}(t), \ldots, v_m^{(l)}(t))$, $\tilde{s}^{(l)}(t)=(s_1^{(l)}(t),s_2^{(l)}(t), \ldots, s_m^{(l)}(t))$, and $s_p^{(l)}(t)=v_p^{(l)}(t-\sum_{i=p}^{m}\lambda_i^{(l)})$.

The function of the l-th (1≦l≦L) multilevel delay processor is shown in FIG. 6, where the input sequence is $\bar{v}^{(l)}$ and the output sequence is $\bar{s}^{(l)}$. This multilevel delay processor divides the sequence $\bar{v}^{(l)}$ into m subsequences which correspond to m levels in such a way that there is a bottom-to-top multilevel delay construction, which means that the p-th level is delayed by $\lambda_p^{(l)}$ time units as compared to the (p+1)-th level, 1≦p≦m. This implies that $$s_p^{(l)}(t) = v_p^{(l)}\left(t - \sum_{i=p}^{m} \lambda_i^{(l)}\right), 1 \leq p \leq m,$$

where each $\lambda_p^{(l)}$ is a nonnegative constant. Note that at the beginning of transmission, there are bit positions in the upper levels (i.e., levels with smaller p) which are not assigned using the previously stated formula. These bit positions can be filled with arbitrary bit values which are recognized by both the transmitting side and the receiving side.

Figure 7:
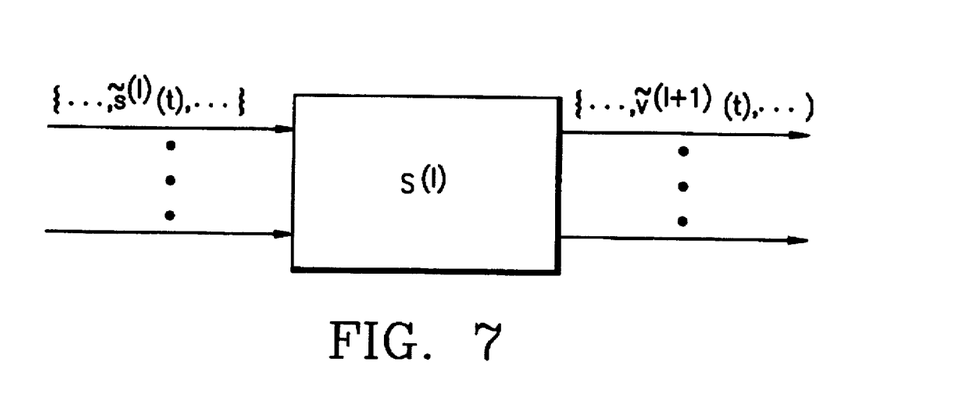

The function of the l-th (1≦l≦L) signal mapper is shown in FIG. 7, where the input sequence is $\bar{s}^{(l)}$. This signal mapper maps each input m-tuple $\tilde{s}^{(l)}(t)$ into an output symbol $w^{(l)}(\tilde{s}^{(l)}(t))=\tilde{v}^{(l+1)}(t)$. For 1≦l≦L-1, the output symbol $\tilde{v}^{(l+1)}(t)$ is a binary m-tuple. For the L-th signal mapper, the output symbol $\tilde{v}^{(L+1)}(t)$ may or may not be a binary m-tuple. It depends on the signal space $\Omega$.

For this specific trellis code, it is desired that $\Lambda^{(l)}$ be no less than $\sum_{i=1}^{m} \lambda_i^{(l)}$ in the decoding to achieve good error performance.

4

BRIEF DESCRIPTION OF THE DRAWINGS

FIG. 5 illustrates a multilevel encoding method of the trellis code T, where

E represents the encoder of the convolutional code $C^{(1)}$, $Q^{(l)}$ represents the l-th multilevel delay processor, $S^{(l)}$ represents the l-th signal mapper, $\bar{u}=\{\ldots, \tilde{u}(t-1), \tilde{u}(t), \tilde{u}(t+1), \ldots\}$, $\bar{v}^{(l)}=\{\ldots, \tilde{v}^{(l)}(t-1), \tilde{v}^{(l)}(t), \tilde{v}^{(l)}(t+1), \ldots\}$, and $\bar{s}^{(l)}=\{\ldots, \tilde{s}^{(l)}(t-1), \tilde{s}^{(l)}(t), \tilde{s}^{(l)}(t+1), \ldots\}$;

FIG. 7 is the function diagram of the l-th signal mapper, where $\tilde{v}^{(l+1)}(t)=w^{(l)}(\tilde{s}^{(l)}(t))$;

when l<L, $\tilde{v}^{(l+1)}(t)$ is a binary m-tuple, when l=L, $\tilde{v}^{(l+1)}(t)$ is a signal point in $\Omega$;

DESCRIPTION OF THE PREFERRED EMBODIMENTS

Figure 5:
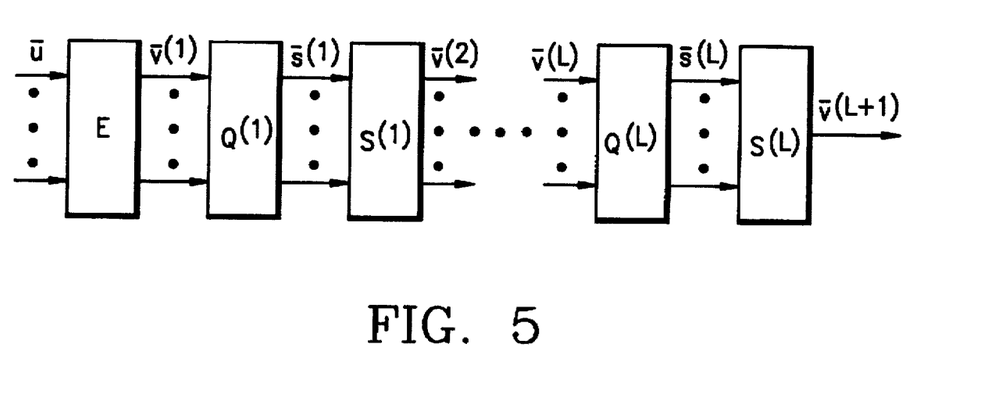

These embodiments are first used to show that it is possible to design trellis codes with large free distances, which can be encoded by using the multilevel encoding method illustrated in FIG. 5. Then, these embodiments will demonstrate the powerful capabilities of the proposed decoding method.

Suppose the signal space $\Omega$ consists of $2^m$ signal points $z_1, z_2, \ldots, z_{2^m}$. The signal space $\Omega$ can be partitioned into an m-level structure such that each signal point z corresponds to a unique binary m-tuple $\tilde{s}=(s_1,s_2, \ldots, s_m)$ for $z \in \{z_1,z_2, \ldots, z_{2^m}\}$ and $s_1,s_2, \ldots, s_m \in \{0,1\}$. Let the mapping relation between z and $\tilde{s}$ be $w(\tilde{s})=z$. The level distance $\Delta_p$ of the signal space $\Omega$ is defined as follows:

$$\Delta_p = \begin{cases} \min\{\Delta(z,z'): z,z' \in \Omega, z \neq z'\} & p = 1, \\ \min\{\Delta(z,z'): z,z' \in \Omega, z \neq z' & 1 < p \leq m. \\ \text{and } s_j = s'_j \text{ for } 1 \leq j < p\} \end{cases}$$

Figure 8:
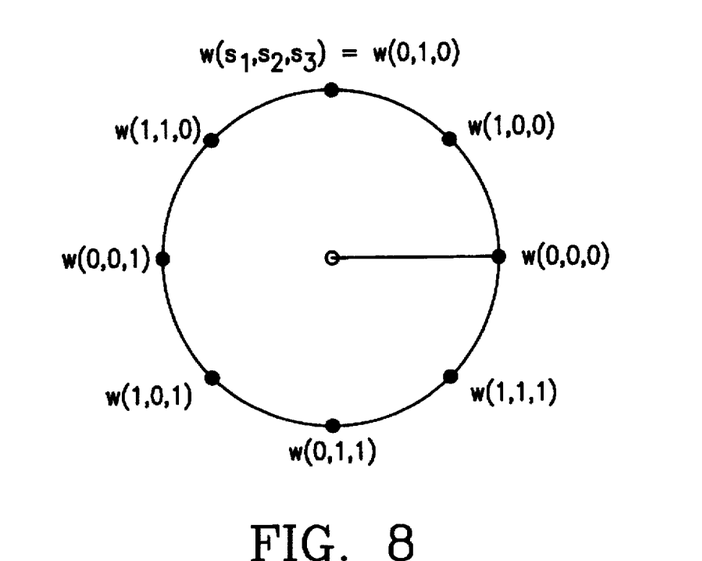
FIG. 8 shows an 8PSK signal constellation.

If $\Omega$ is a signal constellation then $\Delta(z, z')$ stands for the squared Euclidean distance between z and z', i.e., $D^2(z, z')$; and if $\Omega$ is a collection of binary m-tuples then $\Delta(z, z')$ stands for the Hamming distance between z and z', i.e., $d(z, z')$. It can be said that the distance structure of the signal space is $\{\Delta_1, \Delta_2, \ldots, \Delta_m\}$. For example, the 8PSK signal constellation can be partitioned into a three-level structure as shown in FIG. 8, for which the distance structure is described by $$\Delta_1 = D_1^2 = 0.586, \Delta_2 = D_2^2 = 2, \Delta_3 = D_3^2 = 4.$$

Moreover, for example, the collection of binary two-tuples $\Omega = \{0,1\}^2 \{z_0 = (0,0), z_1 = (1,0), z_2 = (0,1), z_3 = (1,1)\}$ can be partitioned as $$\begin{aligned} \Omega &= \{z_0, z_1, z_2, z_3\} \\ &= \{\omega(\tilde{s}_0) = \omega(0,0) = z_0, \omega(\tilde{s}_1) = \omega(1,0) = z_1, \\ &\quad \omega(\tilde{s}_2) = \omega(0,1) = z_3, \omega(\tilde{s}_3) = \omega(1,1) = z_2\} \end{aligned}$$

The distance structure for $\Omega$ is described by $$\begin{aligned} \Delta_1 = d_1 &= \min\{d(z,z'): z,z' \in \Omega, z \neq z'\} = 1, \\ \Delta_2 = d_2 &= \min\{d(z,z'): z,z' \in \Omega, z \neq z', \text{and } s_1 = s'_1\} \\ &= \min\{d(\omega(\tilde{s}_0), \omega(\tilde{s}_2)), d(\omega(\tilde{s}_1), \omega(\tilde{s}_3))\} \\ &= \min\{d(z_0, z_3), d(z_1, z_2)\} = 2. \end{aligned}$$

Note that, $\tilde{v}^{(l)}(t)$ depends not only on the current input symbol, i.e., $\tilde{u}(t)$, but also on the previous input information symbols, i.e., $\tilde{u}(t-i)$, $i>0$, (each is an r-tuple). Hence the collection of all the possible output sequences $\tilde{v}^{(l)}$ is a trellis code $C^{(l)}$ for $1 \leq l \leq L+1$. Note that for $1 \leq l \leq L$, $C^{(l)}$ is a binary trellis code since each $\tilde{v}^{(l)}(t)$ is a binary m-tuple. Also note that $C^{(L+1)}$ is the desired trellis code T. In general, the free distance of $C^{(l+1)}$ can be found from the knowledge of the distance property of $C^{(l)}$ for $l=1, 2, \ldots, L$. In the following, the derivation of free distance of $C^{(L+1)}=T$ from $C^{(L)}$ is illustrated, where the delay constants are set to be $$\lambda_p^{(L)} = \lambda^{(L)}, 1 \leq p \leq m-1, \text{ and}$$

$$\lambda_m^{(L)} = 0.$$

Let $\bar{v} = \{\ldots, \tilde{v}(t-1), \tilde{v}(t), \tilde{v}(t+1), \ldots\}$ and $\bar{v}' = \{\ldots, \tilde{v}'(t-1), \tilde{v}'(t), \tilde{v}'(t+1), \ldots\}$ be two distinct code sequences of the binary trellis code $C^{(L)}$. Let $\bar{s} = \{\ldots, \tilde{s}(t-1), \tilde{s}(t), \tilde{s}(t+1), \ldots\}$ and $\bar{s}' = \{\ldots, \tilde{s}'(t-1), \tilde{s}'(t), \tilde{s}'(t+1), \ldots\}$ be the associated s sequences obtained by going through the multilevel delay processor $Q^{(L)}$. The associated w sequences are $\bar{w} = \{\ldots w(\tilde{s}(t-1)), w(\tilde{s}(t)), w(\tilde{s}(t+1)), \ldots\}$ and $\bar{w}' = \{\ldots, w(\tilde{s}'(t-1)), w(\tilde{s}'(t)), w(\tilde{s}'(t+1)), \ldots\}$, respectively. Note that here $\bar{v}$, $\bar{s}$, and $\bar{w}$ are used instead of $\bar{v}^{(L)}$, $\bar{s}^{(L)}$ and $\bar{v}^{(L+1)}$, respectively, to simplify the notation. Suppose that the Hamming distance between $\bar{v}$ and $\bar{v}'$ is d. Suppose that among the d positions for which $\bar{v}$ and $\bar{v}'$ are distinct, $d_p$ of them are located in the p-th level. We use $d(\bar{v},\bar{v}')=(d_1, d_2, \ldots, d_m)$ to represent this condition. It is clear that $d = \sum_{p=1}^{m} d_p$.

If $\lambda^{(L)}$ is large enough, the distance between $\bar{w}$ and $\bar{w}'$ can be calculated to be $$\Delta(\bar{\omega},\bar{\omega}') \geq \sum_{p=1}^{m} \Delta_p d_p.$$

Note that $\Delta(\bar{w},\bar{w}')$ stands for the squared Euclidean distance between $\bar{w}$ and $\bar{w}'$ if $\Omega$ is a signal constellation, and $\Delta(\bar{w},\bar{w}')$ stands for the Hamming distance between the binary representations of $\bar{w}$ and $\bar{w}'$ if $\Omega$ is a collection of binary m-tuples.

Consider the following example. Let m=2 and $\bar{v}=(\ldots, (00), (00), (00), \ldots)$ and $\bar{v}'=(\ldots, (00), \tilde{v}'(t)=(10), \tilde{v}'(t+1)=(01), \tilde{v}'(t+2)=(11), \tilde{v}'(t+3)=(10), (00), \ldots)$. It is seen that $d(\bar{v},\bar{v}')=(d_1=3, d_2=2)$. Moreover, $d=5=d_1+d_2$. Through the multilevel delay processor $Q^{(L)}$ with the constant $\lambda^{(L)}=4$, sequences $\bar{v}$ and $\bar{v}'$ are converted into sequences $\bar{s}$ and $\bar{s}'$, which are respectively given by $$\bar{s} = \begin{bmatrix} \ldots & \overset{\tilde{s}(t)}{\downarrow} & \overset{\tilde{s}(t+1)}{\downarrow} & & \overset{\tilde{s}(t+3)}{\downarrow} & & \overset{\tilde{s}(t+6)}{\downarrow} & & \overset{\tilde{s}(t+8)}{\downarrow} & & \ldots \\ \ldots & 0 & 0 & 0 & 0 & 0 & 0 & 0 & 0 & 0 & \ldots \\ \ldots & 0 & 0 & 0 & 0 & 0 & 0 & 0 & 0 & 0 & \ldots \end{bmatrix} \begin{matrix} s_1 \\ s_2 \end{matrix}$$

and $$\bar{s}' = \begin{bmatrix} \ldots & \overset{\tilde{s}'(t)}{\downarrow} & \overset{\tilde{s}'(t+1)}{\downarrow} & & \overset{\tilde{s}'(t+3)}{\downarrow} & & \overset{\tilde{s}'(t+6)}{\downarrow} & & \overset{\tilde{s}'(t+8)}{\downarrow} & & \ldots \\ \ldots & 0 & 0 & 0 & 0 & 1 & 0 & 1 & 1 & 0 & \ldots \\ \ldots & 0 & 1 & 1 & 0 & 0 & 0 & 0 & 0 & 0 & \ldots \end{bmatrix} \begin{matrix} s'_1 \\ s'_2 \end{matrix}$$

The output sequences $\bar{w}$ and $\bar{w}'$ are obtained by respectively feeding sequences $\bar{s}$ and $\bar{s}'$ into the signal mapper. Suppose that the signal space is $\{0,1\}^2$ as described in the earlier example, which has a distance structure of $\{\Delta_1=d_1=1, \Delta_2=d_2=2\}$. Note that $d(w(\tilde{s}(t+i)), w(\tilde{s}'(t+i)))=2$ for i=1 and 2, $d(w(\tilde{s}(t+j)), w(\tilde{s}'(t+j)))=1$ for j=4,6 and 7. Thus, $\Delta(\bar{w},\bar{w}')=d(\bar{w},\bar{w}')=2\times 2+1\times 3=7$. Note that in this example, $\lambda \geq 3$ will be large enough to ensure that $\Delta(\bar{w},\bar{w}')$ be equal to 7.

Let $\Delta_{free} = \min_{\substack{\bar{\omega} \neq \bar{\omega}' \\ \bar{\omega}, \bar{\omega}' \in T}} \Delta(\bar{\omega}, \bar{\omega}')$.

enough then $$\Delta_{free} \geq \min_{\substack{\bar{v} \neq \bar{v}' \\ \bar{v}, \bar{v}' \in C^{(L)}}} \left\{ \sum_{p=1}^{m} \Delta_p d_p \right\},$$

where $d(\bar{v}, \bar{v}') = (d_1, d_2, \ldots, d_m)$.

Note that if $\Omega$ is a signal constellation, then $\Delta_{free}$ is the squared free distance of the TCM $C^{(L+1)}=T$, and if $\Omega$ is a collection of binary m-tuples, then $\Delta_{free}$ is the free distance of the binary trellis code $C^{(L+1)}=T$.

To decode the trellis code T, the trellis for the binary convolutional code $C^{(1)}$ will be used. If the number of encoder memory bits for $C^{(1)}$ is v, then the number of states for the associated trellis is $2^v$. In the following, the case of L=2 is used to illustrate the decoding procedure, where the delay constants are set to be $$\lambda_p^{(l)}=\lambda^{(l)}, 1\leq p\leq m-1, \text{ and}$$

$$\lambda_m^{(l)}=0,$$

for $1\leq l\leq L=2$.

Let $\Lambda^{(l)}$ stand for the total delay time between the first and the last level in the l-th multilevel delay processor, i.e., $\Lambda^{(l)}=(m-1)\lambda^{(l)}$, where l=1, 2. Let the truncation length used in decoding the binary convolutional code $C^{(1)}$ be $\lambda$. Set $\lambda^{(1)}\geq\lambda$, $\lambda^{(2)}\geq\lambda+\Lambda^{(1)}$. Let $\bar{y}=\{\ldots, \bar{y}(t-1), \bar{y}(t), \bar{y}(t+1), \ldots\}$ be the received signal sequence, where $\bar{y}(t)$ is the noise-corrupted form of a transmitted symbol $w^{(2)}(\tilde{s}^{(2)}(t))=\tilde{v}^{(3)}(t)$. At the $(t+\Lambda^{(1)}+\Lambda^{(2)})$-th time unit of decoding, $\bar{y}(t+i)$ has already been received for $i\leq\Lambda^{(1)}+\Lambda^{(2)}$.

Assume that $\tilde{v}^{(i)}(t-j)$ has already been correctly recovered, where $1\leq i\leq 2$ and $j\geq\lambda$. The decoding procedure is described as follows.

Step 1: For p=1,2, ..., m and $v_1^{(2)}(t+\Lambda^{(1)})=0$ and $v_2^{(2)}(t+\Lambda^{(1)})=1$, calculate the bit metric $M_{v_p^{(2)}(t+\Lambda^{(1)})}$ by $\min\{\Delta(\bar{y}(t+\Lambda^{(1)}+\Lambda^{(2)}-(p-1)\lambda^{(2)}), w^{(2)}(\tilde{s})): s_i=v_i^{(2)}(t-((p-i)\lambda^{(2)}-\Lambda^{(1)}))$ for $1\leq i<p$; $s_p=v_p^{(2)}(t+\Lambda^{(1)})$; $s_k \in \{0,1\}$ for $k=p+1, \ldots, m.\}$ Note that since $(p-i)\lambda^{(2)}-\Lambda^{(1)}\geq\lambda$, then $v_i^{(2)}(t-((p-i)\lambda^{(2)}-\Lambda^{(1)}))$ has been already recovered, and note that $$v_i^{(2)}(t-((p-i)\lambda^{(2)}-\Lambda^{(1)})) = s_i^{(2)}(t-(p-i)\lambda^{(2)}+\Lambda^{(1)}+(m-i)\lambda^{(2)})$$
$$= s_i^{(2)}(t+\Lambda^{(1)}+(m-1)\lambda^{(2)}-(p-1)\lambda^{(2)})$$
$$= s_i^{(2)}(t+\Lambda^{(1)}+\Lambda^{(2)}-(p-1)\lambda^{(2)}).$$

Moreover, $s_i$ is used to replace $s_i^{(2)}(t+\Lambda^{(1)}+\Lambda^{(2)}-(p-1)\lambda^{(2)})$ in the above formula for simplifying the notation.

By summing $M_{v_1^{(2)}(t+\Lambda^{(1)})}, \ldots, M_{v_m^{(2)}(t+\Lambda^{(1)})}$, the metric $M_{\tilde{v}^{(2)}(t+\Lambda^{(1)})}$ can be calculated, where $\tilde{v}^{(2)}(t+\Lambda^{(1)})=(v_1^{(2)}(t+\Lambda^{(1)}), \ldots, v_m^{(2)}(t+\Lambda^{(1)}))$. The set of metrics $T_M^{(2)}(t+\Lambda^{(1)})=\{M_{\tilde{v}^{(2)}(t+\Lambda^{(1)})}: \tilde{v}^{(2)}(t+\Lambda^{(1)}) \in \{0,1\}^m\}$ will be used in step 2.

Step 2: For p=1, 2, ..., m, calculate the bit metric $M_{v_p^{(1)}(t)}$ by using
$\min\{M_{\tilde{v}^{(2)}(t_p)}: s_i^{(1)}(t_p)=v_i^{(1)}(t_p-(m-i)\lambda^{(1)})$ for $i=1,2, \ldots, p-1$; $s_p^{(1)}(t_p)=v_p^{(1)}(t)$; and $s_k^{(1)} \in \{0,1\}$ for $k=p+1, \ldots, m.\}$, where $t_p=t+\Lambda^{(1)}-(p-1)\lambda^{(1)}$ and $s_i^{(1)}(t_p)=v_i^{(1)}(t_p-(m-i)\lambda^{(1)})=v_i^{(1)}(t-(p-i)\lambda^{(1)})$ which was recovered for $i<p$ by our assumption.

By summing $M_{v_1^{(1)}(t)}, \ldots, M_{v_m^{(1)}(t)}$, the metric $M_{\tilde{v}^{(1)}(t)}$ can be calculated. The set of metrics $T_M^{(1)}(t)=\{M_{\tilde{v}^{(1)}(t)}: \tilde{v}^{(1)}(t) \in \{0,1\}^m\}$ will be used in step 3.

Step 3: The r-bit information $\tilde{u}(t-\lambda+1)$ and the associated $\tilde{v}^{(1)}(t-\lambda+1)$ are recovered by applying the Viterbi algorithm to the $2^\nu$-state trellis for $C^{(1)}$ and by the metrics $M_{\tilde{v}^{(1)}(t-i)} \in T_M^{(1)}(t-i)$ for $i\geq 0$. Then, $\tilde{s}^{(1)}(t-\lambda+1)$ is derived from $\{\tilde{v}^{(1)}(t-j): j\geq\lambda-1\}$. By feeding $\tilde{s}^{(1)}(t-\lambda+1)$ into the first signal mapper, $\tilde{v}^{(2)}(t-\lambda+1)$ is recovered. Then the decoding procedure is back to step 1.

Note that for the L=2 case, the first encoded message $\tilde{u}(1)$ is recovered at the $(\lambda+\Lambda^{(1)}+\Lambda^{(2)})$-th time unit of decoding. In the case of $L\geq 2$, the first encoded message $\tilde{u}(1)$ is recovered at the $(\lambda+\Lambda^{(1)}+ \ldots +\Lambda^{(L)})$-th time unit of decoding, where $\Lambda^{(l)}\geq\sum_{i=1}^m \lambda_i^{(l)}$ and $\lambda^{(l)}\geq\lambda+\Lambda^{(1)}+ \ldots +\Lambda^{(l-1)}$ for each l.

Now consider the first embodiment. Set L=2 and choose $\Omega$ to be the 8PSK signal constellation which is partitioned into a three-level structure with a distance structure of $\{\Delta_1=0.586, \Delta_2=2, \Delta_3=4\}$. The delay constants are set to be $$\lambda_p^{(l)}=\lambda^{(l)}, 1\leq p\leq 2, \text{ and}$$

$$\lambda_3^{(l)}=0,$$

for $1\leq l\leq L=2$. The mapping $w^{(1)}(s_1^{(1)}, s_2^{(1)}, s_3^{(1)})=(v_1^{(2)}, v_2^{(2)}, v_3^{(2)})$ for the first signal mapper is described as follows:

$w^{(1)}(0,0,0)=(0,0,0)$  $w^{(1)}(0,0,1)=(1,1,1)$
$w^{(1)}(0,1,0)=(1,1,0)$  $w^{(1)}(0,1,1)=(0,0,1)$
$w^{(1)}(1,0,0)=(1,0,0)$  $w^{(1)}(1,0,1)=(0,1,1)$
$w^{(1)}(1,1,0)=(0,1,0)$  $w^{(1)}(1,1,1)=(1,0,1)$

A rate ⅔ binary convolutional code $C^{(1)}$ with $\nu=2$ is used, which implies that the number of trellis states is $2^2=4$. The generator matrix for the code $C^{(1)}$ is $$\begin{pmatrix} 1 & 1 & 1 \\ 5 & 7 & 0 \end{pmatrix}.$$

Figure 9:
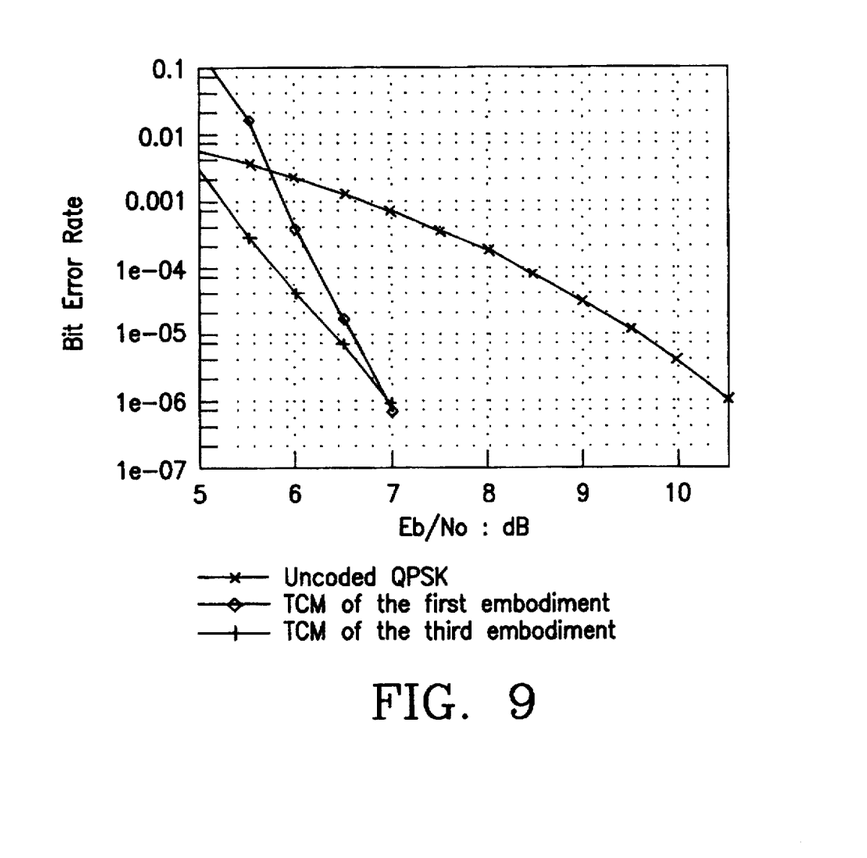
FIG. 9 shows the simulation results of TCM in additive white Gaussian noise channel for the first and the third embodiments.

In this way, the trellis code T is a TCM for which its coding rate is 2 information bits per signal point in the 8PSK signal constellation. From computer search, the squared free distance of this TCM is calculated to be $\Delta_{free}=D_{free}^2\geq 7.516$. Compared to uncoded QPSK, this TCM has an asymptotic coding gain of 5.75 dB in AWGN channel. Note that for the 4-state TCM designed by Ungerboeck in 1982, the asymptotic coding gain is only 3.0 dB. Simulation results obtained by using the proposed decoding method and by setting the delay constant $\lambda=\lambda^{(1)}=30$ and $\lambda^{(2)}=90$ are shown in FIG. 9. From FIG. 9, it is seen that using the proposed decoding method for this TCM, the coding gain over uncoded QPSK is about 3.6 dB at bit error rate of $10^{-6}$.

Consider the second embodiment for which L is also set to be 2. Choose $\Omega=\{0,1\}^2$ which is partitioned into a two-level structure with a distance structure of $\{\Delta_1=1, \Delta_2=2\}$. The delay constants are set to be $$\lambda_p^{(l)}=\lambda^{(l)}, p=1, \text{ and}$$

$$\lambda_2^{(l)}=0,$$

for $1\leq l\leq L=2$. Both of the two mappings of the signal mappers are the same and are described as follows:

$w(0,0)=(0,0)$, $w(0,1)=(1,1)$, $w(1,0)=(1,0)$ and $w(1,1)=(0,1)$, where $w=w^{(1)}, w^{(2)}$.

Figure 10:
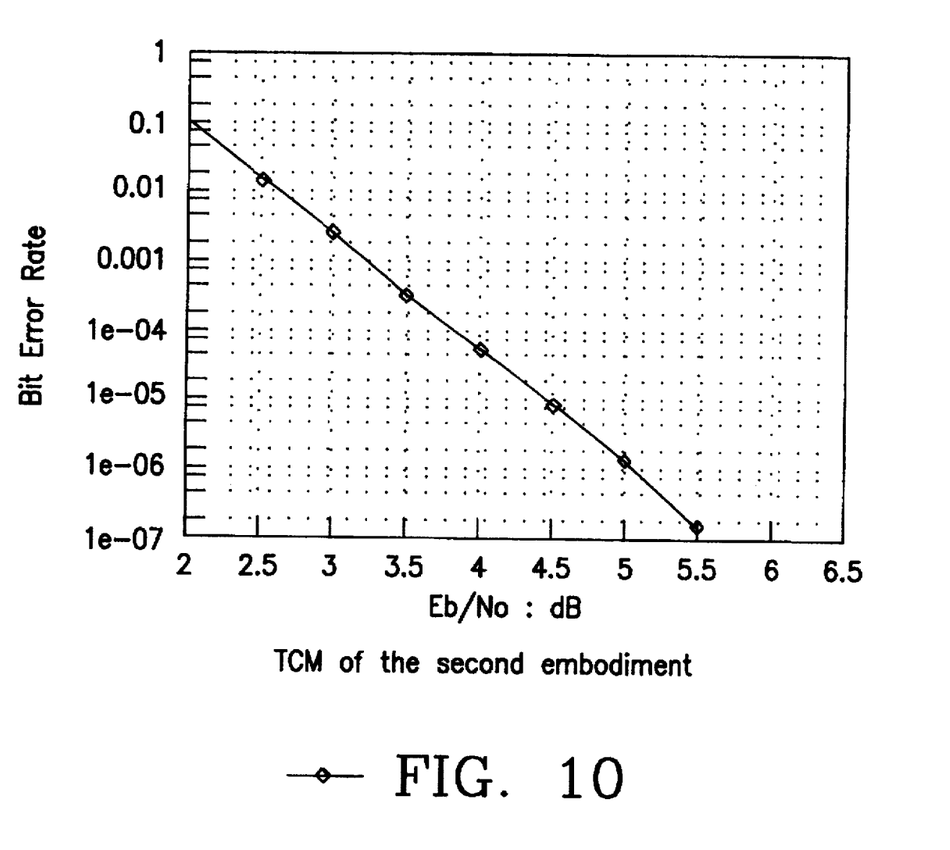
FIG. 10 shows the simulation results of binary trellis codes in additive white Gaussian noise channel for the second embodiment.

A rate ½ binary convolutional code $C^{(1)}$ with $\nu=2$ is used, which implies that the number of trellis states is $2^2=4$. The generator matrix of $C^{(1)}$ is G=(5 7). In this way, the trellis code T is a binary trellis code for which its coding rate is ½. From computer search, the free distance of this binary trellis code is calculated to be at least 11. In comparison, the best known binary convolutional code with 4 trellis states has a free distance of only 5. Simulation results obtained by using the proposed decoding method and by setting $\lambda=\lambda^{(1)}=20$ and $\lambda^{(2)}=40$ are shown in FIG. 10. From FIG. 10, it is seen that bit error rate of $10^{-6}$ can be obtained at $E_b/N_0=5.2$ dB.

In each of the above two embodiments, $\lambda_p^{(l)}$ of the l-th multilevel delay processor is set to be equal to $\lambda^{(l)}$ for $p \in \{1, \ldots, m-1\}$ and l=1, 2. The third embodiment is given to show a more general case of T in which some of the delay time $\lambda_p^{(l)}$, $p \in \{1, \ldots, m-1\}$ in the l-th multilevel delay processor may be zero.

The third embodiment is obtained by modifying the first embodiment. The signal space $\Omega$ and the first multilevel delay processor $Q^{(1)}$ and the signal mappers $S^{(1)}$ and $S^{(2)}$ used in the third embodiment are the same as those used in the first embodiment. However, in the third embodiment, the truncation length $\lambda$ and delay constants $\lambda_p^{(l)}$ are set to be $\lambda=\lambda_1^{(1)}=\lambda_2^{(1)}=30$, $\lambda_3^{(1)}=\lambda_2^{(2)}=\lambda_3^{(2)}=0$ and $\lambda_1^{(2)}=90$. Then, T is a TCM for which its squared free distance can be calculated to be $\Delta_{free} = D_{free}^2 \geq 5.76$. The decoding for the third embodiment is similar to that for the first embodiment except for slight modification. For the third embodiment the decoding delay time is shorter than that for the first embodiment. Simulation results obtained by using the proposed decoding are also shown in FIG. 9.

One of the characteristics of the l-th multilevel delay processor used in the encoding for T, which is illustrated in FIG. 5, is to process the input bits in each level such that the p-th level will be delayed by $\lambda_p^{(l)}$ time units as compared to the (p+1)-th level. Note that in general for each l, $\lambda_1^{(l)}, \lambda_2^{(l)}, \ldots, \lambda_m^{(l)}$ may not necessarily be identical and some but not all $\lambda_p^{(l)}$ can be set to be zero. Basically, this encoding uses the encoder of a binary convolutional code to generate m bits, which are then processed by L multilevel delay processors and L signal mappers, where $L \geq 2$. This encoding can easily be generalized to a multilevel encoding based on the encoders of several binary convolutional codes. The design is as follows. Use q (q<m) encoders of binary convolutional codes to totally generate m bits, i.e., $v_1^{(1)}(t), v_2^{(1)}(t), \ldots, v_m^{(1)}(t)$, which are then processed by L ($L \geq 2$) multilevel delay processors and signal mappers to select a signal point in the signal space $\Omega$. In this case, the proposed decoding method must be slightly modified so that the processor $P^{(0)}$ applies Viterbi decoding algorithms to the several binary trellis codes, instead of applying the Viterbi decoding algorithm to a single binary trellis code.

In addition, there is a generalization of the trellis code T suitable for the proposed decoding method which can be implemented in the following way. At each time unit, the encoder of a binary convolutional code is used to generate $m/m^{(1)}$ binary $m^{(1)}$-tuples which are combined to be represented by the binary m-tuple $\tilde{v}^{(1)}(t)$. For $1 \leq l \leq L$, each binary m-tuple $\tilde{v}^{(l)}(t)$ is decomposed into $m/m^{(l)}$ binary $m^{(l)}$-tuples. Moreover, $\tilde{v}^{(L+1)}(t)$ represents $m/m^{(L+1)}$ signal points in $\Omega$ which consists of $2^{(m^{(L+1)})}$ signal points. Hence, for each time unit, the trellis code T yields $m/m^{(L+1)}$ signal points in $\Omega$ as output. The proposed decoding method is still valid by noting that each $\tilde{v}^{(l)}(t)$ represents several binary $m^{(l)}$-tuples for $1 \leq l \leq L$ and several signal points in $\Omega$ for $l=L+1$.

Finally, the encoder of the binary convolutional code $C^{(1)}$ used in encoding and decoding T can be replaced by the encoder of a more general binary trellis code.

What is claimed is:

1. A decoding method for a trellis code T of which the encoding can be implemented by first using an encoder of a binary trellis code $C^{(1)}$ to encode an r-bit message $\tilde{u}(t)$ into an intermediate binary m-tuple $\tilde{v}^{(1)}(t)$ at a t-th time unit which is sequentially converted into binary m-tuples $\tilde{v}^{(2)}(t), \ldots, \tilde{v}^{(L)}(t)$ and a signal point $\tilde{v}^{(L+1)}(t)$ in a signal space $\Omega$ through L ($L \geq 2$) processors, comprising the decoding steps of:

(a) at a $(t+\Lambda^{(l)}+ \ldots +\Lambda^{(L)})$-th time unit, a processor $P^{(L)}$ determining a set $T_M^{(L)}(t+\Lambda^{(l)}+ \ldots +\Lambda^{(L-1)})$ which consists of $2^m$ metrics for the $2^m$ possible values of $\tilde{v}^{(L)}(t+\Lambda^{(l)}+ \ldots +\Lambda^{(L-1)})$, based on part of the set $\{y(t+i): i \leq \Lambda^{(l)}+ \ldots +\Lambda^{(L)}\}$ and part of the set $\{\tilde{v}^{(L)}(t-j): j \geq \lambda\}$; feeding the metric set $T_M^{(L)}(t+\Lambda^{(l)}+ \ldots +\Lambda^{(L-1)})$ into a processor $P^{(L-1)}$; wherein $y(t+i)$ is a received symbol to be decoded, $\Lambda^{(1)}, \ldots, \Lambda^{(L)}$ are nonnegative constants and $\lambda$ is a truncation length to be used in decoding $C^{(1)}$;

(b) for $l=L-1, L-2, \ldots, 1$, a processor $P^{(l)}$ determining a set $T_M^{(l)}(t+\Lambda^{(l)}+ \ldots +\Lambda^{(l-1)})$ which consists of $2^m$ metrics for the $2^m$ possible values of $\tilde{v}^{(l)}(t+\Lambda^{(l)}+ \ldots +\Lambda^{(l-1)})$ based on part of $\{T_M^{(l+1)}(t+i): i \leq \Lambda^{(l)}+ \ldots +\Lambda^{(l)}\}$ and part of the set $\{\tilde{v}^{(l)}(t-j): j \geq \lambda\}$; feeding the metric set $T_M^{(l)}(t+\Lambda^{(l)}+ \ldots +\Lambda^{(l-1)})$ into a processor $P^{(l-1)}$; wherein $\Lambda^{(l)}$ is a nonnegative constant;

(c) a processor $P^{(0)}$ recovering the transmitted symbol $\tilde{u}(t-\lambda+1)$ and $\tilde{v}^{(1)}(t-\lambda+1)$ by applying the Viterbi decoding algorithm to the trellis of $C^{(1)}$ and using part of the set $\{T_M^{(1)}(t-i): i \geq 0\}$; feeding back the recovered $\tilde{v}^{(1)}(t-\lambda+1)$ to $P^{(1)}$;

(d) for $l=1, 2, \ldots, L-1$, $P^{(l)}$ processing the set $\{\tilde{v}^{(l)}(t-j): j \geq \lambda-1\}$ and determining $\tilde{v}^{(l+1)}(t-\lambda+1)$ which is then fed back to $P^{(l+1)}$.

2. A decoding method as in claim 1, wherein the encoder of said single binary trellis code $C^{(1)}$ is replaced by the encoders of a plurality of binary trellis codes which together convert $\tilde{u}(t)$ into $\tilde{v}^{(1)}(t)=(v_1^{(1)}(t), v_2^{(1)}(t), \ldots, v_m^{(1)}(t))$, which is then processed by L multilevel delay processors and L signal mappers; and wherein said Viterbi decoding algorithm for $C^{(1)}$ used in the processor $P^{(0)}$ is replaced by a plurality of Viterbi decoding algorithms for said plurality of binary trellis codes.

3. An decoding method as in claims 1 or 2, wherein the encoding of said trellis code T can be implemented by the steps of:

i) using the encoder of a single binary trellis code $C^{(1)}$ to encode an r-bit message $\tilde{u}(t)$ at the t-th time unit so as to obtain an m-bit output $\tilde{v}^{(1)}(t)=(v_1^{(1)}(t), v_2^{(1)}(t), \ldots, v_m^{(1)}(t))$;

ii) processing said output of the encoder through a multilevel delay processor $Q^{(1)}$ to obtain a processed output $\tilde{s}^{(1)}(t)=(s_1^{(1)}(t), s_2^{(1)}(t), \ldots, s_m^{(1)}(t))$ such that $$s_p^{(l)}(t) = v_p^{(l)}\left(t - \sum_{i=p}^{m} \lambda_i^{(l)}\right), 1 \leq p \leq m,$$

wherein $\lambda_1^{(1)}, \lambda_2^{(1)}, \ldots, \lambda_m^{(1)}$ are nonnegative constants;

iii) feeding said output of $Q^{(1)}$ into a signal mapper $S^{(1)}$ to select a signal point $w^{(1)}(\tilde{s}^{(1)}(t)) = \tilde{v}^{(2)}(t)=(v_1^{(2)}(t), v_2^{(2)}(t), \ldots, v_m^{(2)}(t))$;

iv) for $l=2, 3, \ldots, L$, feeding the output $\tilde{v}^{(l)}(t)$ into a multilevel delay processor $Q^{(l)}$ to obtain a processed output $\tilde{s}^{(l)}(t)=(s_1^{(l)}(t), s_2^{(l)}(t), \ldots, s_m^{(l)}(t))$, such that $$s_p^{(l)}(t) = v_p^{(l)}\left(t - \sum_{i=p}^{m} \lambda_i^{(l)}\right), 1 \leq p \leq m,$$

wherein $\lambda_1^{(l)}, \lambda_2^{(l)}, \ldots, \lambda_m^{(l)}$ are nonnegative constants, and then feeding $\tilde{s}^{(l)}(t)$ into a signal mapper $S^{(l)}$ to select a signal point $w^{(l)}(\tilde{s}^{(l)}(t)) = \tilde{v}^{(l+1)}(t)$, whereby if $l<L$, $\tilde{v}^{(l+1)}(t)$ is a binary m-tuple and if $l=L$, $\tilde{v}^{(l+1)}(t)$ is in the signal space $\Omega$ and is the output signal point.

4. A decoding method as in claim 3, wherein the parameter $\lambda^{(l)}$ of the processor $P^{(l)}$ is no less than $\Sigma_{i=1}^{m} \lambda_i^{(l)}$ for $1 \leq l \leq L$.

5. A decoding method as in claim 3, wherein said constants $\lambda_1^{(l)}, \lambda_2^{(l)}, \ldots, \lambda_m^{(l)}$ are distinct values and/or at least one of the constants $\lambda_1^{(l)}, \lambda_2^{(l)}, \ldots, \lambda_m^{(l)}$ is not zero.

6. A decoding method as in claim 3, wherein said constants $\lambda_1^{(l)}, \lambda_2^{(l)}, \ldots, \lambda_{m-1}^{(l)}$ are all identical to a constant $\lambda^{(l)}$ and $\lambda_m^{(l)}=0$.

7. A decoding method as in claims 1 or 2, wherein said binary trellis code or a plurality of binary trellis codes is/are a linear and time-invariant code or a plurality of linear and time-invariant codes respectively, i.e., a binary convolutional code or a plurality of binary convolutional codes.

8. A decoding method as in claims 1 or 2, wherein the signal space $\Omega$ is a signal constellation; then said method can be used to decode trellis coded modulation.

9. A decoding method as in claims 1 or 2, wherein the signal space $\Omega$ is a collection of binary m-tuples; then said method can be used to decode binary trellis codes.

10. A decoding method as in claims 1 or 2, wherein the r-bit information, $\tilde{u}(t)$, represents $m/m^{(1)}$ binary $(r \cdot m^{(1)}/m)$-tuples, whereby $m^{(1)}$ is a positive integer.

11. A decoding method as in claims 1 or 2, wherein the binary m-tuple $\tilde{v}^{(l)}(t)$, $1 \leq l \leq L$, can be decomposed into $m/m^{(l)}$ binary $m^{(l)}$-tuples, wherein $m^{(l)}$ is a positive integer; and $\tilde{v}^{(L+1)}(t)$ represents $m/m^{(L+1)}$ signal points in $\Omega$ which consists of $2^{(m^{(L+1)})}$ signal points, wherein $m^{(L+1)}$ is a positive integer.

* * * * *